(12) United States Patent
Yu et al.

(10) Patent No.: US 12,396,378 B2
(45) Date of Patent: Aug. 19, 2025

(54) MEMRISTOR HAVING METAL/ION CHANNELS FORMED IN INSULATING LAYER AND RESISTIVE SWITCHING MEMORY DEVICE INCLUDING THE SAME

(71) Applicant: Research & Business Foundation Sungkyunkwan University, Suwon-si (KR)

(72) Inventors: Woojong Yu, Suwon-si (KR); Thanh Luan Phan, Suwon-si (KR); Hyungjin Kim, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 476 days.

(21) Appl. No.: 17/491,843

(22) Filed: Oct. 1, 2021

(65) Prior Publication Data

US 2022/0123208 A1  Apr. 21, 2022

(30) Foreign Application Priority Data

Oct. 21, 2020  (KR) .......................... 10-2020-0136810

(51) Int. Cl.
*H10N 70/00* (2023.01)
*H10B 63/00* (2023.01)
*H10N 70/20* (2023.01)

(52) U.S. Cl.
CPC .......... *H10N 70/828* (2023.02); *H10B 63/20* (2023.02); *H10N 70/046* (2023.02); *H10N 70/25* (2023.02); *H10N 70/8416* (2023.02); *H10N 70/883* (2023.02)

(58) Field of Classification Search
CPC .................................................... H10N 70/828
See application file for complete search history.

(56) References Cited

U.S. PATENT DOCUMENTS

| | | | | |
|---|---|---|---|---|
| 2010/0117052 | A1* | 5/2010 | Venkatasamy | ......... H10B 63/80 |
| | | | | 257/E47.001 |
| 2016/0276588 | A1* | 9/2016 | Tour | .................... H01L 29/1606 |
| 2021/0083181 | A1* | 3/2021 | Chen | ...................... H10B 63/24 |

FOREIGN PATENT DOCUMENTS

| | | |
|---|---|---|
| KR | 10-2016-0088380 A | 7/2016 |
| KR | 10-2016-0125843 A | 11/2016 |
| KR | 10-2017-0127497 A | 11/2017 |
| KR | 10-2020-0075321 A | 6/2020 |

\* cited by examiner

*Primary Examiner* — Ajay Ojha
*Assistant Examiner* — Hajar Kolahdouzan
(74) *Attorney, Agent, or Firm* — NSIP Law

(57) ABSTRACT

Provided is a memristor including an active electrode made of a first conductive material including an active metal; an inert electrode spaced from and facing toward the active electrode and made of a second conductive material having an ionization energy greater than the ionization energy of the first conductive material; and a resistive switching layer including: a porous insulating layer disposed between the active electrode and the inert electrode, wherein the porous insulating layer has through-channel holes defined therein extending from a bottom face to a top face thereof; and conductive filaments respectively formed inside the through-channel holes.

12 Claims, 6 Drawing Sheets

[FIG. 1]
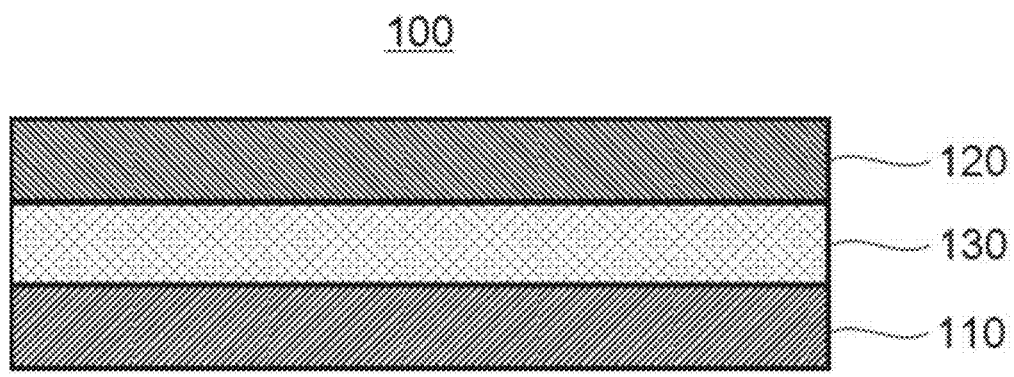
[FIG. 2]
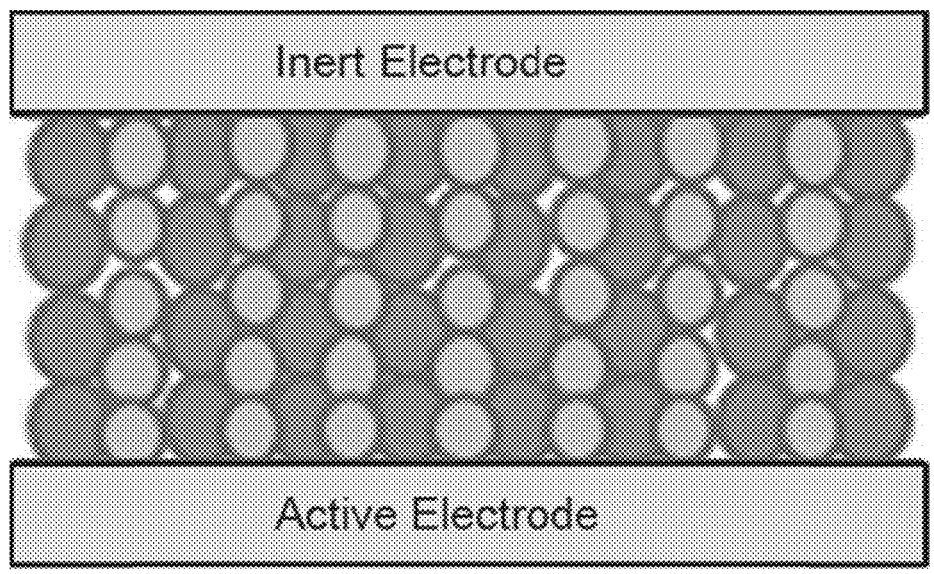

[FIG. 3]
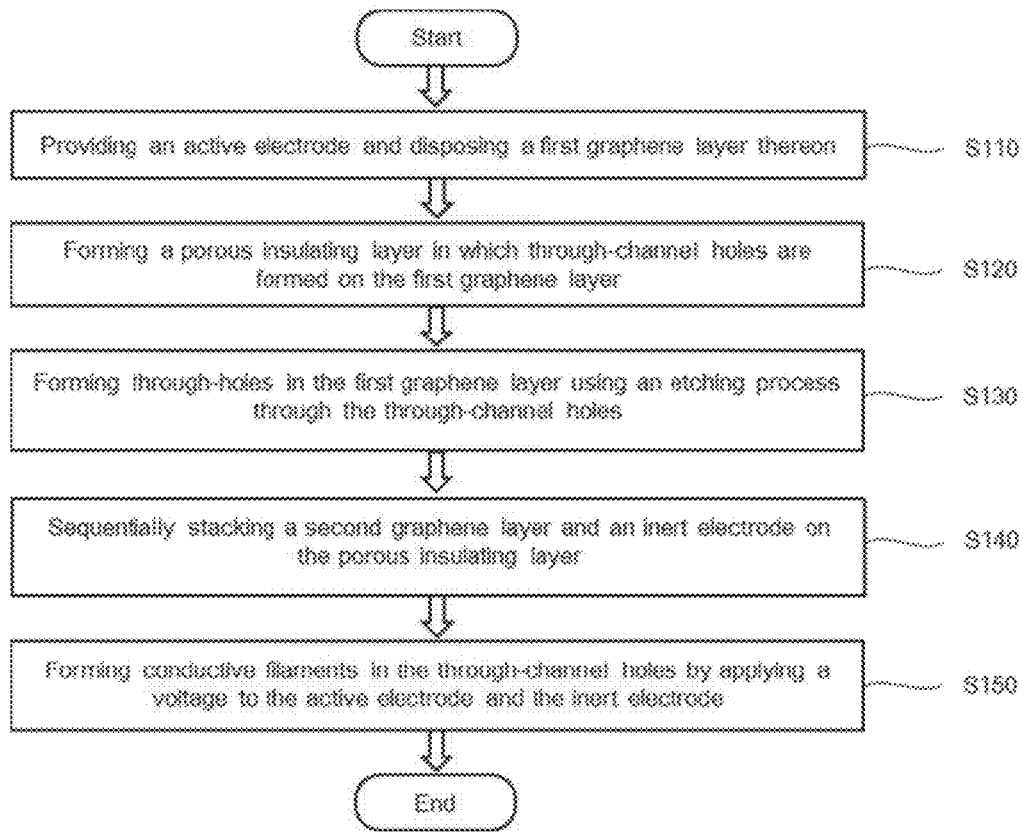
[FIG. 4A]
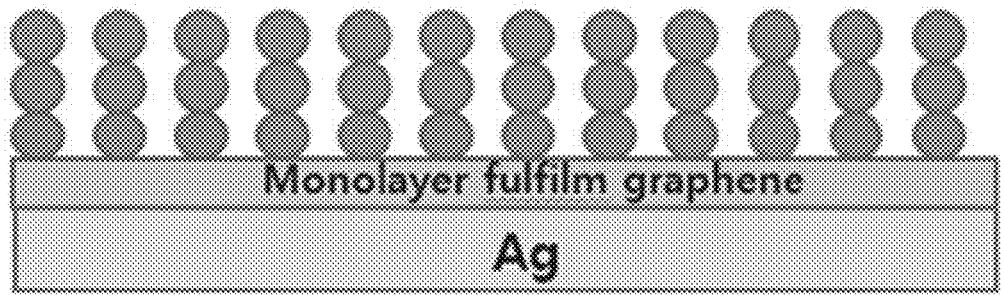

[FIG. 4B]
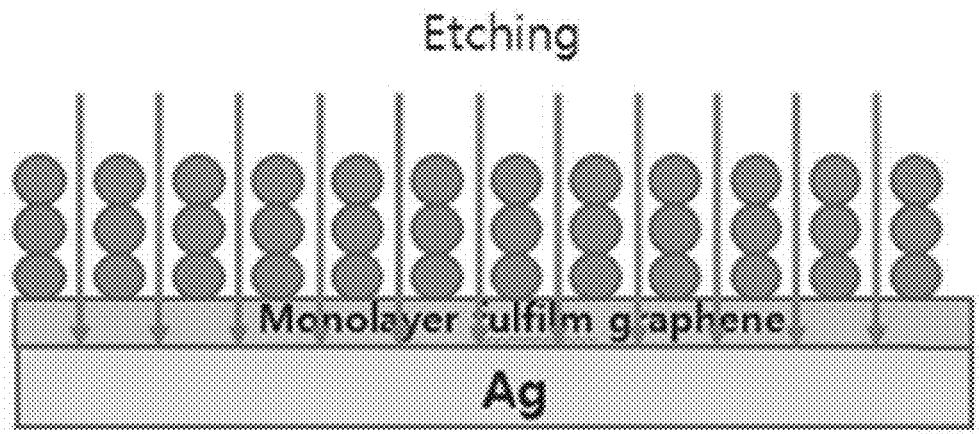
[FIG. 4C]
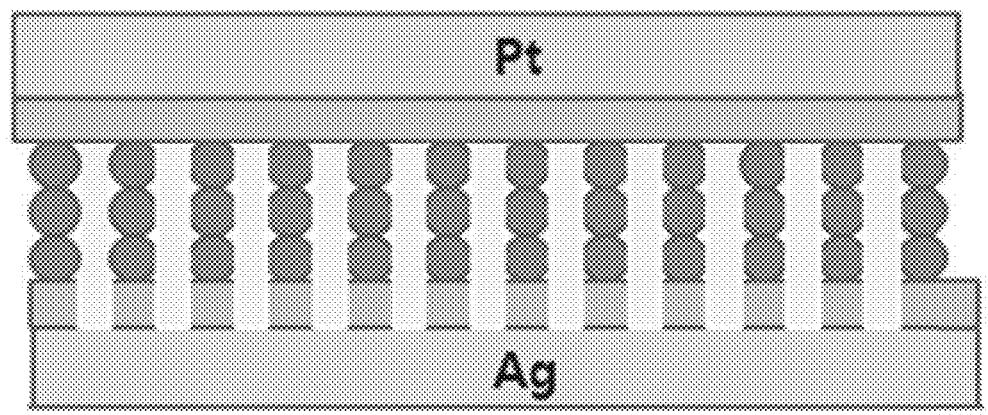
[FIG. 4D]
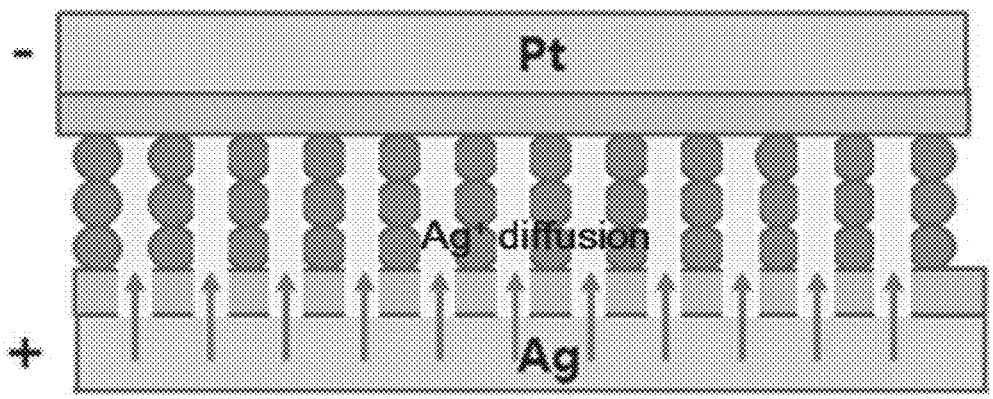

[FIG. 5]
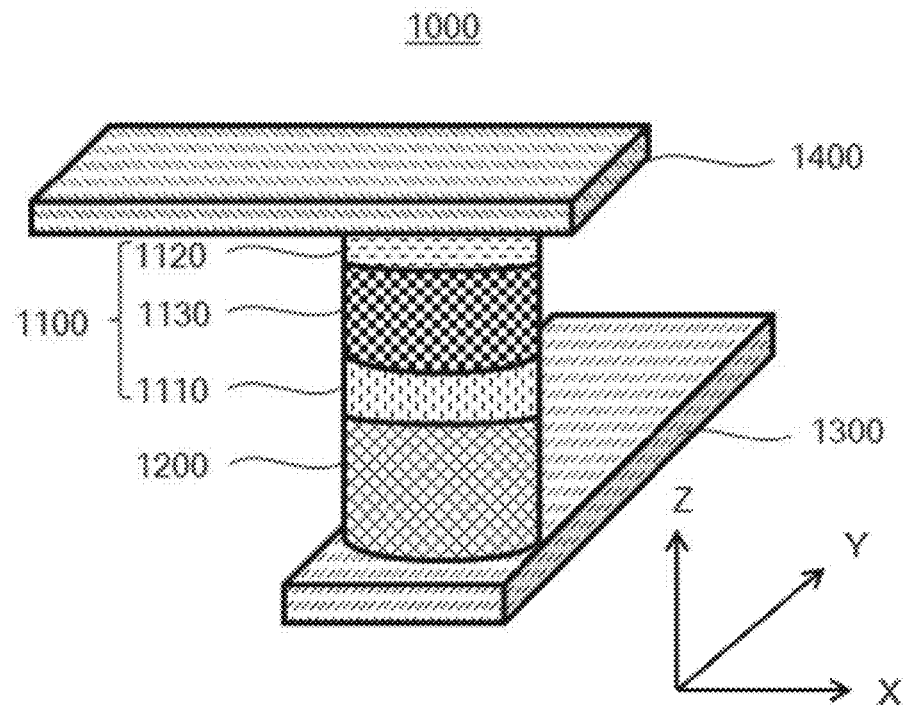

[FIG. 6]
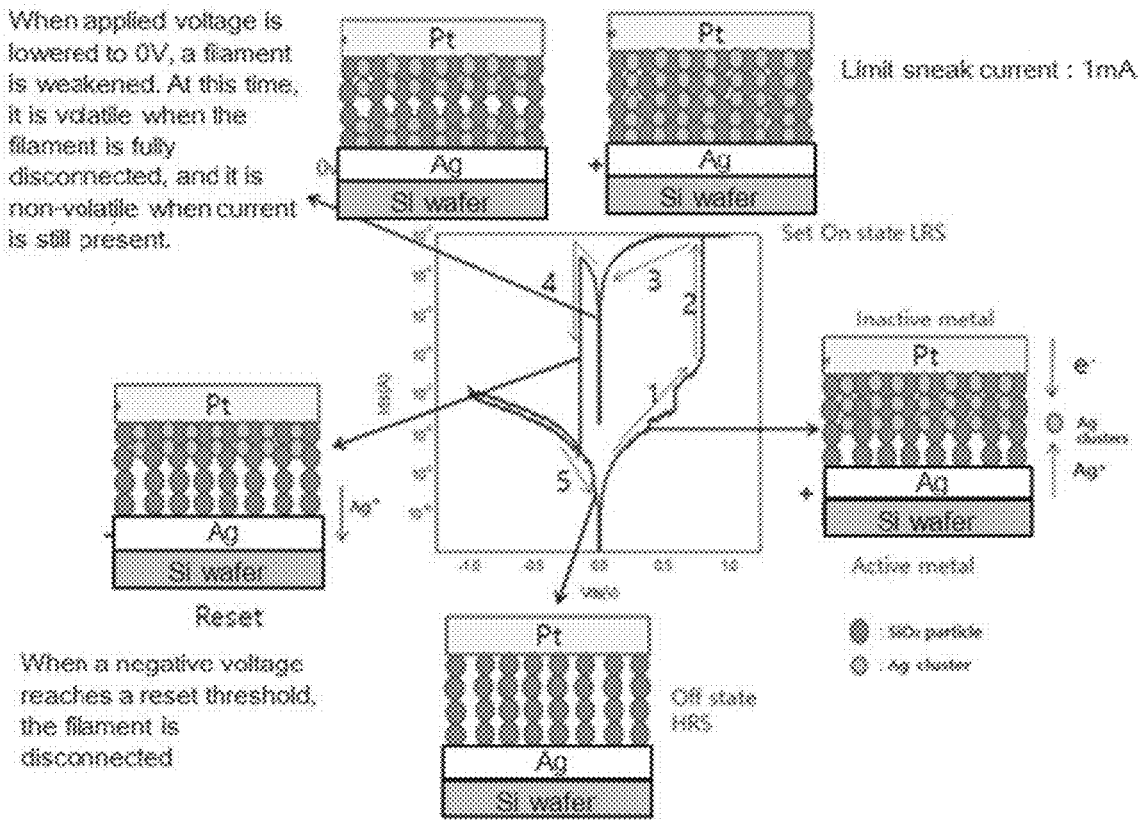

[FIG. 7]
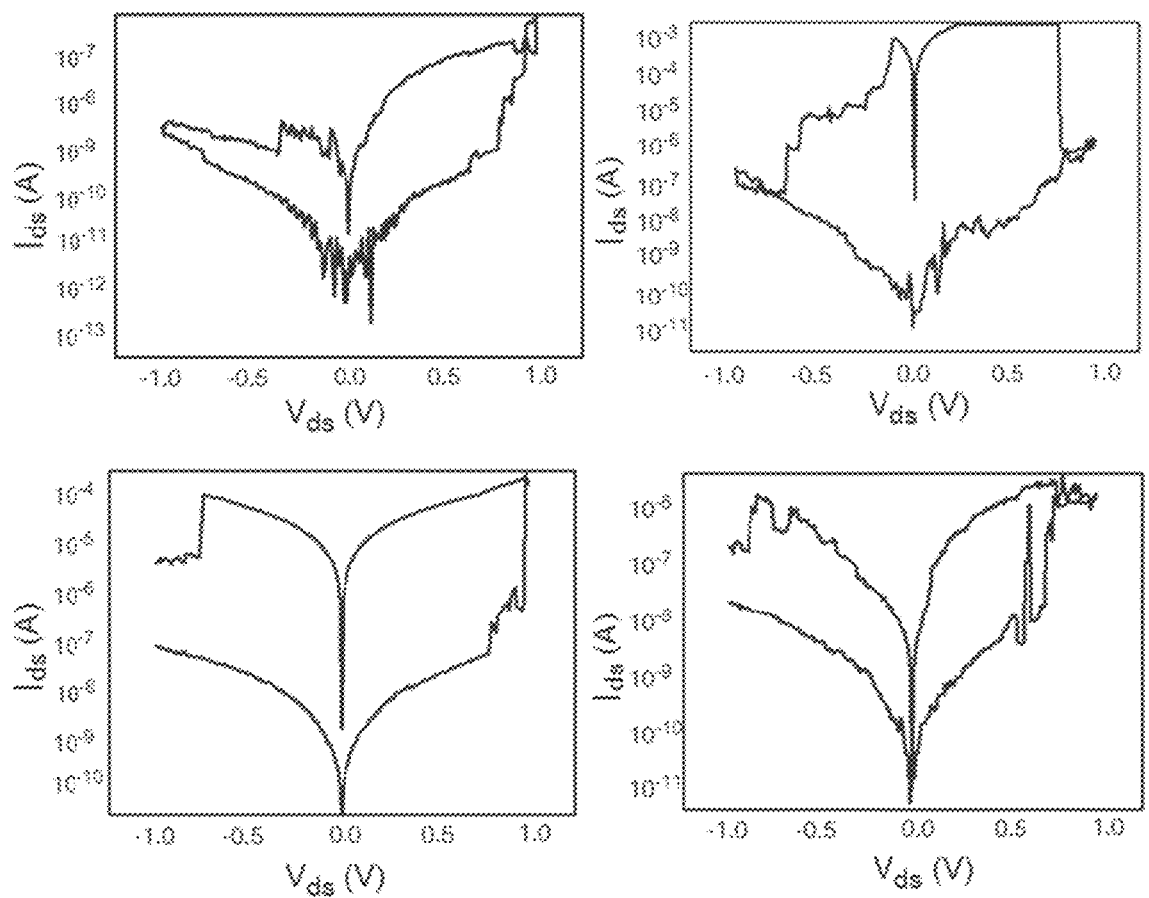

MEMRISTOR HAVING METAL/ION CHANNELS FORMED IN INSULATING LAYER AND RESISTIVE SWITCHING MEMORY DEVICE INCLUDING THE SAME

CROSS-REFERENCE TO RELATED APPLICATION

This application claims a benefit under 35 U.S.C. § 119(a) of Korean Patent Application No. 10-2020-0136810 filed on Oct. 21, 2020, on the Korean Intellectual Property Office, the entire disclosure of which is incorporated herein by reference for all purposes.

BACKGROUND

1. Field

The present disclosure relates to a memristor capable of storing information based on resistance change, a manufacturing method thereof, and a resistive switching memory device including the same.

2. Description of Related Art

A memristor is a nano-scale passive device that links magnetic flux and electric charges to each other and memorizes an amount of the electric charge and has a resistance varying based on the amount of the electric charge. Even when power supply thereto is cut off, the memristor may memorize a current amount and a current direction immediately before the power supply cut off. Thus, the memristor may restore a previous state when power is again supplied thereto. Such a memristor together with a resistor, a capacitor, and an inductor constitute an electric circuit.

The memristor as a two-terminal device may have a simpler structure than that of a three-terminal device, that is, a transistor, and may be designed in a space-efficient manner. An ON/OFF switching operation thereof is 5 times or greater faster than that of the transistor, and power consumption thereof is smaller by 50% than that of the transistor. Thus, many studies are being conducted to apply the memristor to a next-generation memory device or a neuromorphic system.

Oxides, nitrides, and organic materials have been studied as memristor materials that have been mainly used. Recently, studies on a memristor using an organic/inorganic perovskite material having a high driving voltage and a relatively low on/off ratio of $10^5$ or greater are being conducted.

However, in a resistive switching memory device having a plurality of conventional memristors, operating characteristics of the memristor, in particular, switching voltages thereof are not uniform, which is an obstacle to commercialization thereof. Currently, development of new schemes capable of solving this problem is in progress.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter.

One purpose of the present disclosure is to provide a memristor in which a resistive switching layer includes a porous insulating layer in which through-channel holes of relatively uniform diameters are pre-formed, and conductive filaments are respectively formed only inside the through-channel holes unlike a conventional manner in which the conductive filaments are not uniformly formed inside the insulating layer via electrochemical diffusion of metal ions, thereby achieving significantly improved low-power operation, uniformity of operating voltage, and reliability of operating characteristics.

Another purpose of the present disclosure is to provide a manufacturing method of the memristor.

Still another purpose of the present disclosure is to provide a resistive switching memory device having the memristor.

Purposes of the present disclosure are not limited to the above-mentioned purpose. Other purposes and advantages of the present disclosure as not mentioned above may be understood from following descriptions and more clearly understood from embodiments of the present disclosure. Further, it will be readily appreciated that the purposes and advantages of the present disclosure may be realized by features and combinations thereof as disclosed in the claims.

A first aspect of the present disclosure provides a memristor comprising: an active electrode made of a first conductive material including an active metal; an inert electrode spaced from and facing toward the active electrode and made of a second conductive material having an ionization energy greater than the ionization energy of the first conductive material; and a resistive switching layer including: a porous insulating layer disposed between the active electrode and the inert electrode, wherein the porous insulating layer has through-channel holes defined therein extending from a bottom face to a top face thereof; and conductive filaments respectively formed inside the through-channel holes.

In one implementation of the memristor, the active electrode is made of at least one selected from a group consisting of copper (Cu), silver (Ag), aluminum (Al), titanium (Ti) and tantalum nitride (TaN), wherein the inert electrode is made of at least one selected from a group consisting of platinum (Pt), gold (Au), palladium (Pd), ITO, and nickel (Ni).

In one implementation of the memristor, the porous insulating layer is made of a material selected from a group consisting of silicon oxide ($SiO_2$), hafnium oxide ($HfO_2$), aluminum oxide ($Al2O_3$), titanium oxide ($TiO_x$), aluminum-titanium oxide ($AlTiO_x$), and magnesium oxide (MgO).

In one implementation of the memristor, each of the through-channel holes has an average diameter of 5 to 100 nm.

In one implementation of the memristor, each conductive filament fills an entire interior of each through-channel hole.

In one implementation of the memristor, a void not filled with each conductive filament is formed in at least a portion of each through-channel hole.

In one implementation of the memristor, the memristor further includes a first graphene layer disposed between the active electrode and the resistive switching layer, wherein the first graphene layer has through-holes defined therein communicating with the through-channel holes, respectively, and has electrical conductivity.

In one implementation of the memristor, the memristor further includes a second graphene layer having electrical conductivity and disposed between the inert electrode and the resistive switching layer.

A second aspect of the present disclosure provides a method for manufacturing a memristor, the method comprising: a first step of forming an active electrode including an active metal; a second step of forming a porous insulating layer having through-channel holes defined therein on the active electrode; a third step of forming an inert electrode on the porous insulating layer; and a fourth step of by applying a first and positive voltage and a ground voltage to the active electrode and the inert electrode, respectively to induce diffusion and reduction of active metal ions through an inside of the through-channel holes to form each of conductive filaments inside each of the through-channel holes.

In one implementation of the method, the first voltage is equal to or greater than a second voltage required for active metal ions to diffuse through the through-channel holes to form the conductive filaments extending from the active electrode and through the porous insulating layer, and is smaller than a third voltage required to diffuse the active metal ions through a medium of the porous insulating layer to form the conductive filaments extending from the active electrode and through the porous insulating layer.

In one implementation of the method, the method further comprises: between the first step and the second step, a step of forming a first graphene layer positioned between the active electrode and the porous insulating layer; and between the second step and the third step, a step of forming through-holes respectively corresponding to the through-channel holes in the first graphene layer, using plasma etching through the through-channel holes of the porous insulating layer.

In one implementation of the method, the method further comprises: between the second step and the third step, a step of forming a second graphene layer positioned between the inert electrode and the porous insulating layer.

A third aspect of the present disclosure provides a resistive switching memory device comprising: a first signal line a second signal line disposed in different layers and intersecting with each other; and a memory cell and a selector element disposed between the first signal line and the second signal line and in an intersection area between the first signal line and the second signal line, wherein the memory cell and the selector element are connected to the first signal line and the second signal line, and are connected in series to each other, wherein the memory cell includes: a first electrode electrically connected to one of the first signal line and the second signal line; a second electrode electrically connected to the selector element; and a resistive switching layer disposed between the first electrode and the second electrode, wherein the resistive switching layer includes: a porous insulating layer having through-channel holes defined therein extending from a bottom face to a top face thereof; and conductive filaments respectively formed inside the through-channel holes.

In one implementation of the device, the porous insulating layer is made of a material selected from a group consisting of silicon oxide ($SiO_2$), hafnium oxide ($HfO_2$), aluminum oxide ($Al2O_3$), titanium oxide ($TiO_x$), aluminum-titanium oxide ($AlTiO_x$), and magnesium oxide (MgO), wherein each of the through-channel holes has an average diameter of 5 to 100 nm.

In one implementation of the device, each conductive filament fills an entire interior of each through-channel hole.

In one implementation of the device, a void not filled with each conductive filament is formed in at least a portion of each through-channel hole.

According to the memristor, the manufacturing method thereof and the resistive switching memory device including the same according to the present disclosure, the resistive switching layer positioned between the active electrode and the inert electrode may include the porous insulating layer in which the through-channel holes having relatively uniform diameters are formed, and the conductive filaments may be respectively formed only inside the through-channel holes, thereby remarkably improving the uniformity of the operating voltage of the memristor and the reliability of the operating characteristics thereof. Further, a forming step is not required or the conductive filament may be formed inside the porous insulating layer by applying a remarkably low forming voltage.

In addition to the effects as described above, specific effects of the present disclosure will be described together with the detailed description for carrying out the disclosure.

BRIEF DESCRIPTION OF DRAWINGS

FIG. 1 is a diagram for illustrating a memristor according to an embodiment of the present disclosure.

FIG. 2 is a diagram for illustrating a resistive switching layer in which a conductive filament is formed.

FIG. 3 is a flowchart for illustrating a manufacturing method of a memristor according to the embodiment of the present disclosure.

FIG. 4A to FIG. 4D are process diagrams for illustrating the manufacturing method of the memristor shown in FIG. 3.

FIG. 5 is a perspective view for illustrating a nonvolatile memory device according to an embodiment of the present disclosure.

FIG. 6 is a voltage-current graph showing a result of measuring operating characteristics of a memristor according to an example.

FIG. 7 is a graph showing operating characteristics of several different memristors manufactured under the same condition as that in FIG. 6.

DETAILED DESCRIPTIONS

For simplicity and clarity of illustration, elements in the FIGS. are not necessarily drawn to scale. The same reference numbers in different FIGS. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a view for illustrating a memristor according to an embodiment of the present disclosure. FIG. 2 is a view for illustrating a resistive switching layer in which a conductive filament is formed.

Referring to FIG. 1 and FIG. 2, a memristor 100 according to an embodiment of the present disclosure may include a first electrode 110, a second electrode 120, and a resistive switching layer 130.

The first electrode 110 and the second electrode 120 may be disposed to face toward each other while being spaced apart from each other, and may be made of an electrically conductive material. For example, each of the first electrode 110 and the second electrode 120 may be made of a conductive oxide, a conductive metal, a conductive nitride, a conductive polymer, a conductive carbon-based material, or the like. The conductive oxide may include at least one selected from indium tin oxide (ITO), fluorine tin oxide (FTO), $ZnO-Ga_2O_3$, $ZnO-Al_2O_3$, tin-based oxide, zinc oxide, and the like. The conductive metal may include at least one selected from aluminum (Al), molybdenum (Mo), tungsten (W), titanium (Ti), platinum (Pt), chromium (Cr), silicon (Si), gold (Au), nickel (Ni), copper One or more selected from (Cu), silver (Ag), indium (In), ruthenium (Ru), palladium (Pd), rhodium (Rh), iridium (Ir), osmium (Os), etc.

In one embodiment, one of the first electrode 110 and the second electrode 120 may be an active electrode made of a conductive material having a relatively low ionization energy such as at least one selected from copper (Cu), silver (Ag), aluminum (Al), titanium (Ti), tantalum nitride (TaN), etc. The other thereof may be an inert electrode made of a conductive material such as platinum (Pt), gold (Au), palladium (Pd), ITO, nickel (Ni), which has a relatively higher ionization energy than that of the material of the active electrode.

The resistive switching layer 130 may be disposed between the first electrode 110 and the second electrode 120 and may be reversibly changed from a high resist state to a low resist state and from a low resist state to a high resist state based on voltage applied to the first electrode 110 and the second electrode 120. For example, a resistive switching operation may be executed via formation and destruction of a conductive filament inside the resistive switching layer 130. For example, switching from a high resist state to a low resist state ('SET') may occur via the formation of the conductive filament, while switching from a low resist state to a high resist state ('RESET') may occur via breaking of the conductive filament.

In one embodiment, the resistive switching layer 130 may include a porous insulating layer in which through-channel holes extending from a bottom face to a top face thereof are formed, and conductive filaments respectively formed in the through-channel holes.

The porous insulating layer may be made of a transition metal oxide. For example, the porous insulating layer may be made of a material selected from silicon oxide ($SiO_2$), hafnium oxide ($HfO_2$), aluminum oxide ($Al2O_3$), titanium oxide ($TiO_x$), aluminum-titanium oxide ($AlTiO_x$), magnesium oxide (MgO), and the like.

The conductive filaments may be formed via diffusion and reduction of active metal ions electrochemically diffused from the active electrode into the hoes under an electric field generated between the first and second electrodes 110 and 120. In one embodiment, the conductive filament may be formed using the metal growing from a wall surface of the through-channel hole. In this case, the conductive filament may fill an entire interior of the through-channel hole.

Alternatively, a void not filled with the conductive filament may be formed in at least a portion of the through-channel hole.

According to the present disclosure, when the resistive switching layer 130 includes a porous insulating layer in which the through-channel holes are formed, energy required for diffusion of the active metal ion through an inside of the through-channel holes may be lower than the diffusion of the active metal ion through an inside of the insulating layer medium, such that a forming voltage applied to the first and second electrodes to form the conductive filaments may be significantly lowered.

Further, when forming the through-channel holes such that sizes thereof are relatively uniform in a process of forming the porous insulating layer, the resistive switching layer 130 may include the conductive filaments having relatively uniform sizes. Thus, uniform distributions of SET voltages and RESET voltages for driving the memristor according to the present disclosure may be significantly improved, thereby remarkably improving the uniformity and reliability of the operating characteristics of the memristor.

In one embodiment, each of the through-channel holes may be formed to have an average diameter of about 5 to 100 nm. When the average diameter of each of the through-channel holes is smaller than 5 nm, the forming voltage for forming the conductive filament increases, and the operating characteristics thereof become non-uniform due to formation of the conductive filaments having an excessively small size. When the average diameter of each of the through-channel holes exceeds 100 nm, an operating voltage of the memristor increases due to formation of an excessively large filament, and an operating characteristic thereof becomes non-uniform. For example, each of the through-channel holes may be formed to have an average diameter of about 7 to 20 nm.

In one example, the memristor 100 according to an embodiment of the present disclosure may further include a first graphene layer (see FIG. 4A) disposed between the active electrode of the first and second electrodes 110 and 120 and the resistive switching layer 130 and having electrical conductivity.

The first graphene layer may have through-holes defined therein corresponding to the through-channel holes formed in the resistive switching layer 130. In the process of forming the conductive filament, the active metal ions may flow into the porous insulating layer using the through-holes of the first graphene layer, and as a result, uniform conductive filaments may be formed inside the porous insulating layer.

In one embodiment, the memristor 100 according to an embodiment of the present disclosure may further include a second graphene layer (see FIG. 4C) disposed between the inert electrode of the first and second electrodes 110 and 120 and the resistive switching layer 130 and having electrical conductivity.

Unlike the first graphene layer, in the second graphene layer, through-holes may not be formed. Thus, the second graphene layer may prevent the metal ions from the inert electrode from diffusing into the porous insulating layer during the forming process for forming the conductive filament or an operation process of the memristor.

FIG. 3 is a flow chart for illustrating a manufacturing method of a memristor according to an embodiment of the present disclosure. FIG. 4A to FIG. 4D are process diagrams for illustrating the manufacturing method of the memristor shown in FIG. 3.

Referring to FIG. 3 and FIG. 4A to FIG. 4D along with FIG. 1 and FIG. 2, the manufacturing method of the memristor according to the embodiment of the present disclosure includes a first step (S110) of providing an active electrode and disposing a first graphene layer thereon; a second step (S120) of forming a porous insulating layer in which through-channel holes are formed on the first graphene layer; a third step (S130) of forming through-holes in the first graphene layer using an etching process through the through-channel holes; a fourth step (S140) of sequentially stacking a second graphene layer and an inert electrode on the porous insulating layer; and a fifth step (S150) of forming conductive filaments in the through-channel holes by applying a voltage to the active electrode and the inert electrode.

In the first step (S110), the active electrode may be made of a conductive material including an active metal, and a formation method thereof is not particularly limited. For example, the active electrode may be formed on a substrate (not shown) using a method such as vapor deposition or sputtering of a conductive material including an active metal. A method of forming the first graphene layer on the active electrode is not particularly limited. For example, the first graphene layer may be formed on the active electrode using a transfer process or directly grown on the active electrode. The first graphene layer may be formed as a mono layer or a few layers to have electrical conductivity.

In the second step (S120), the porous insulating layer may be made of a transition metal oxide, and a formation method thereof is not particularly limited. However, the porous insulating layer may be formed by controlling a growth condition so that the through-channel holes extending from the top face to the bottom face thereof are uniformly formed therein. In this case, the growth condition of the porous insulating layer may be adjusted so that the through-channel holes, each having a diameter of about 5 to 100 nm, are formed in the porous insulating layer.

In the third step (S130), the through-holes corresponding to the through-channel holes are formed in the first graphene layer using dry or wet etching or plasma etching using the porous insulating layer as a mask. In the plasma etching, the first graphene layer is etched using voids, such that a mask is not required.

In the fourth step (S140), the second graphene layer may be formed on the porous insulating layer, and then the inert electrode may be formed on the second graphene layer. A method of forming the second graphene layer is not particularly limited. For example, the second graphene layer may be formed on top of the porous insulating layer using a transfer process or directly grown on the porous insulating layer. The second graphene layer may be formed as a mono layer or a few layers to have electrical conductivity. The inert electrode may be made of a conductive material having an ionization energy greater than that of the active electrode. A formation method thereof is not particularly limited. For example, the inert electrode may be formed on the second graphene layer using a method such as vapor deposition or sputtering of the conductive material.

In the fifth step (S150), a positive voltage may be applied to the active electrode and a ground voltage may be applied to the inert electrode, such that active metal ions may diffuse from the active electrode into the porous insulating layer. Thus, the conductive filaments may be formed in the through-channel holes in the porous insulating layer.

In one embodiment, the positive voltage applied to the active electrode may be adjusted such that the active metal ions diffuse from the active electrode to the second graphene layer only through the inside of the through-channel holes and do not diffuse to the second graphene layer through the inside of the medium of the porous insulating layer. In this case, the conductive filament may be formed only inside the through-channel holes. For example, a third voltage as the positive voltage may be equal to or greater than a first voltage required to diffuse the active metal ions through the through-channel holes to form the conductive filament connecting the active electrode and the second graphene layer to each other and may be smaller than a second voltage required to diffuse the active metal ions through the medium of the porous insulating layer to form the conductive filament connecting the active electrode and the second graphene layer. Thus, the conductive filaments may be formed only inside the through-channel holes.

Further, due to a dense structure of the graphene, the graphene may generally block diffusion of active metal ions. The first graphene layer has the through-holes defined therein corresponding to the through-channels, respectively. Thus, when the first graphene layer is disposed between the active electrode and the porous insulating layer, the formation position of the conductive filament may be more precisely controlled.

FIG. 5 is a perspective view for illustrating a resistive switching memory device according to an embodiment of the present disclosure.

Referring to FIG. 5, a resistive switching memory device 1000 according to an embodiment of the present disclosure includes a memory cell 1100, a selector element 1200, a first signal line 1300, and a second signal line 1400.

The memory cell 1100 may be disposed between the first signal line 1300 and the second signal line 1400. One of the first signal line 1300 and the second signal line 1400 may be electrically connected to the memory cell 1100.

The memory cell 1100 may include a first electrode 1110, a second electrode 1120, and a resistive switching layer 1130. Because the memory cell 1100 is the same as the memristor 100 as described with reference to FIG. 1, redundant detailed description thereof will be omitted.

In FIG. 5, the second electrode 1120 is electrically connected to the fourth signal line 1400 and the first electrode 1110 is electrically connected to the selector element 1200. However, the disclosure is not limited thereto. Alternatively, the first electrode 1110 may be electrically connected to the first signal line 1300, and the second electrode 1120 may be electrically connected to the selector element 1200.

The selector element 1200 may be connected in series to one of the first signal line 1300 and the second signal line 1400 and the memory cell 1100. The selector element 1200 may suppress sneak current from another neighboring memory cell and thus prevent the sneak current from affecting sensing current of the memory cell 1100. The selector element 1200 is not particularly limited as long as it has a nonlinear current-voltage characteristic having a small resistance value at a sensing voltage such as read or write voltage applied to a selected memory cell, and having a very large resistance value at a low voltage applied to an unselected memory cell. A known selector element may be applied without limitation.

The first signal line 1300 and the second signal line 1400 may extend so as to interest each other. For example, the first signal line 1300 may extend in a first direction (X), and the second signal line 1400 may extend in a second direction (Y) orthogonal to the first direction.

In one example, in FIG. 5, the first signal line 1300 and the second signal line 1400 are shown as electrically connected to one memory cell 1100. The disclosure is not limited thereto. The first signal line 1300 may be electrically connected to a plurality of memory cells arranged in a line along the second direction (Y), and the second signal line 1400 may be electrically connected to a plurality of other memory cells arranged in a line along the first direction (X).

According to the memristor, the manufacturing method thereof and the resistive switching memory device including the same as disclosed in the present disclosure, the resistive switching layer positioned between the active electrode and the inert electrode may include the porous insulating layer in which the through-channel holes having relatively uniform diameters are formed, and the conductive filaments may be respectively formed only inside the through-channel holes, thereby remarkably improving the uniformity of the operating voltage of the memristor and the reliability of the operating characteristics thereof. Further, a forming step is not required or the conductive filament may be formed inside the porous insulating layer by applying a remarkably low forming voltage.

Hereinafter, a specific example of the present disclosure will be described in detail to help the understanding of the present disclosure. However, the following example is only one embodiment of the present disclosure, and the scope of the present disclosure is not limited to the following example.

EXAMPLE

A silver (Ag) active electrode was formed on a silicon wafer. A porous silicon oxide layer having through-channel holes defined therein having an average diameter of about 10 nm was formed on the silver (Ag) active electrode. Then, a platinum (Pt) inert electrode was formed on the porous silicon oxide layer to prepare a memristor.

EXPERIMENTAL EXAMPLE

FIG. 6 is a voltage-current graph showing results of measuring the operating characteristics of the memristor according to the example.

Referring to FIG. 6, it may be identified that the memristor according to the example has a relatively low SET voltage of about 0.8V and a RESET voltage of about –0.2V, and thus the memristor according to the present disclosure has a very low operating voltage.

FIG. 7 is a voltage-current graph as measured for a plurality of memristors manufactured under the same condition as the memristor in FIG. 6.

Referring to FIG. 7, it may be identified similarly that while an operating voltage of a conventional memristor under the same condition is 2V or higher, the operating voltage of the memristor according to the present disclosure is relatively low because the channel holes are formed in the insulating layer.

While the present disclosure has been described with reference to preferred embodiments, those skilled in the art will appreciate that the present disclosure may be variously modified and changed without departing from the spirit and scope of the present disclosure set forth in the following claims.

What is claimed is:
1. A memristor comprising:
an active electrode made of a first conductive material including an active metal;
an inert electrode spaced from and facing toward the active electrode and made of a second conductive material having an ionization energy greater than the ionization energy of the first conductive material; and
a resistive switching layer including:
a porous insulating layer disposed between the active electrode and the inert electrode, wherein the porous insulating layer has through-channel holes defined therein extending from a bottom face to a top face thereof; and
conductive filaments respectively formed inside the through-channel holes,
wherein the memristor further includes a first graphene layer disposed between the active electrode and the resistive switching layer, wherein the first graphene layer has through-holes defined therein communicating with the through-channel holes, respectively, and has electrical conductivity, and
wherein the through-holes are configured to receive a flow of ions of the active metal and to control a formation position of the conductive filaments.

2. The memristor of claim 1, wherein the active electrode is made of at least one selected from a group consisting of copper (Cu), silver (Ag), aluminum (Al), titanium (Ti) and tantalum nitride (TaN),
wherein the inert electrode is made of at least one selected from a group consisting of platinum (Pt), gold (Au), palladium (Pd), ITO, and nickel (Ni).

3. The memristor of claim 1, wherein the porous insulating layer is made of a material selected from a group consisting of silicon oxide ($SiO_2$), hafnium oxide ($HfO_2$), aluminum oxide ($Al_2O_3$), titanium oxide (TiOx), aluminum-titanium oxide ($AlTiO_x$), and magnesium oxide (MgO).

4. The memristor of claim 1, wherein the through-channel holes have an average diameter of 5 to 100 nm.

5. The memristor of claim 1, wherein each conductive filament fills an entire interior of each through-channel hole.

6. The memristor of claim 1, wherein a void not filled with each conductive filament is formed in at least a portion of each through-channel hole.

7. The memristor of claim 1, wherein the through-holes of the first graphene layer correspond to the through-channel holes of the porous insulating layer.

8. The memristor of claim 1, wherein the memristor further includes a second graphene layer having electrical conductivity and disposed between the inert electrode and the resistive switching layer.

9. A resistive switching memory device comprising:
a first signal line and a second signal line disposed in different layers and intersecting with each other; and
a memory cell and a selector element disposed between the first signal line and the second signal line and in an intersection area between the first signal line and the second signal line, wherein the memory cell and the selector element are connected to the first signal line and the second signal line, and are connected in series to each other,
wherein the memory cell includes:
a first electrode electrically connected to one of the first signal line and the second signal line;
a second electrode electrically connected to the selector element; and
a resistive switching layer disposed between the first electrode and the second electrode,
wherein the resistive switching layer includes:
a porous insulating layer having through-channel holes defined therein extending from a bottom face to a top face thereof; and
conductive filaments respectively formed inside the through-channel holes,
wherein the memory cell further includes a first graphene layer disposed between the first electrode and the resistive switching layer, wherein the first graphene layer has through-holes defined therein communicating with the through-channel holes, respectively, and has electrical conductivity.

10. The device of claim 9, wherein the porous insulating layer is made of a material selected from a group consisting of silicon oxide ($SiO_2$), hafnium oxide ($HfO_2$), aluminum oxide ($Al_2O_3$), titanium oxide (TiOx), aluminum-titanium oxide ($AlTiO_x$), and magnesium oxide (MgO),
wherein the through-channel holes have an average diameter of 5 to 100 nm.

11. The device of claim 9, wherein each conductive filament fills an entire interior of each through-channel hole.

12. The device of claim 9, wherein a void not filled with each conductive filament is formed in at least a portion of each through-channel hole.

* * * * *